(12) United States Patent
Szu et al.

(10) Patent No.: US 6,482,032 B1
(45) Date of Patent: Nov. 19, 2002

(54) ELECTRICAL CONNECTOR WITH BOARD LOCKS

(75) Inventors: Ming-Lun Szu, Tu-Chen (TW); Hsiang-Ping Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/036,080

(22) Filed: Dec. 24, 2001

(51) Int. Cl.$^7$ .............................................. H01R 13/73
(52) U.S. Cl. ................................................... 439/567
(58) Field of Search .......................... 439/567, 571, 439/572

(56) References Cited

U.S. PATENT DOCUMENTS

| | | | | |
|---|---|---|---|---|
| 5,542,860 A | * | 8/1996 | Bandura et al. | 439/567 |
| 5,613,877 A | * | 3/1997 | Patel et al. | 439/567 |
| 5,618,129 A | * | 4/1997 | Skarivoda | 439/567 |
| 5,697,812 A | * | 12/1997 | Sampson et al. | 439/567 |
| 5,775,949 A | * | 7/1998 | Bricaud et al. | 439/567 |
| 5,797,768 A | * | 8/1998 | Francwviglia | 439/567 |
| 5,980,314 A | * | 11/1999 | Roberts | 439/567 |
| 6,027,371 A | * | 2/2000 | Lin et al. | 439/567 |

* cited by examiner

Primary Examiner—Gary Paumen
(74) Attorney, Agent, or Firm—WeiTe Chung

(57) ABSTRACT

An electrical connector (1) mounted on a circuit board (5) comprises an insulative housing (2) with a number of terminals (3) retained therein, and a pair of board locks (4) downwardly extending from the housing. Each board lock includes a connecting portion (41) integrally connecting with the housing, a hook (42) formed at a free end of the connecting portion for engaging with a bottom face (53) of the circuit board, and a rib (43) projecting from the connecting portion in a direction opposite to the extending direction of a free end (420) of the hook for abutting against an inner wall (502) of a corresponding through hole (50) of the circuit board.

1 Claim, 3 Drawing Sheets

ELECTRICAL CONNECTOR WITH BOARD LOCKS

BACKGROUND OF THE INVENTION

1. Field of the Invention

The present invention relates to an electrical connector, and particularly to an electrical connector with board locks for reliably and conveniently positioning the connector on a circuit board.

2. Description of Related Art

In circuit board mounted electrical connectors, positioning means is typically provided for holding the connector on the board for facilitating terminal soldering. U.S. Pat. No. 6,027,371 discloses an electrical connector comprising an insulative housing and a pair of metal board locks attached to the housing. Each board lock is stamped from a metal blank and includes a body portion fixed to the housing and a pair of spaced legs with outward barbs. Before terminals of the connector are subject to a soldering process, the board locks are inserted into corresponding through holes defined in a circuit board for positioning the connector on the circuit board.

When the board locks are inserted into the through holes of the circuit board, the spaced legs are compressed to deflect inwardly toward each other. The spaced legs then restore to their original configuration, whereby the barbs latch beneath a bottom face of the circuit board. However, since the board locks and the housing are individually made, additional manufacturing and assembly processes are required, thereby increasing the production cost.

In addition, U.S. Pat. No. 5,980,314 discloses an electrical connector which provides a pair of board locks integrally extending from an insulative housing thereof for insertion into corresponding through holes defined in a circuit board. Each board lock is bifurcated to define a pair of legs separated by an axial slit. The legs have latching surfaces for engaging with a bottom face of the circuit board when the board locks are completely inserted into the through holes of the circuit board. However, because the board lock is inserted into the through hole via its inherent flexible characteristic, a long-term use of the connector will cause plastic deformation of the board lock and this deformation can never resume. As a result, the connector may be unreliably positioned on the circuit board.

Hence, an electrical connector with improved board locks is required to overcome the disadvantages of the related art.

SUMMARY OF THE INVENTION

Accordingly, one object of the present invention is to provide an electrical connector with improved board locks for conveniently and reliably positioning the connector on a circuit board.

Another object of the present invention is to provide an electrical connector with improved board locks which can be ZIF (Zero Insertion Force) inserted into and ZIF pulled from corresponding through holes of a circuit board.

In order to achieve the objects set forth, an electrical connector with a pair of board locks in accordance with the present invention comprises an insulative housing having a mounting face, a plurality of terminals retained in the housing for electrically connecting with a circuit board, and a pair of board locks downwardly extending from opposite ends of the housing. Each board lock includes a connecting portion integrally connecting with the mounting face of the housing, a hook formed at a free end of the connecting portion for engaging with a bottom face of the circuit board, and a rib projecting from the connecting portion in a direction opposite to the extending direction of a free end of the hook for abutting against an inner wall of a corresponding through hole defined in the circuit board. When the connector is mounted on the circuit board, the connector is first placed in an inclined manner relative to the circuit board to allow ZIF insertion of the board locks into the through holes. The connector is then pushed to arrive at a position where the mounting face of the housing is parallel to the circuit board. During the pushing process, because a horizontal distance "L1" between the free end of the hook and an outer side of the rib is larger than a horizontal dimension "L2" of the through hole, the rib of each board lock abuts against an inner wall of the through hole to enable the hook to engage with the bottom face of the circuit board, whereby the connector is reliably positioned on the circuit board.

Other objects, advantages and novel features of the invention will become more apparent from the following detailed description when taken in conjunction with the accompanying drawings.

DETAILED DESCRIPTION OF THE INVENTION

Figure 1:
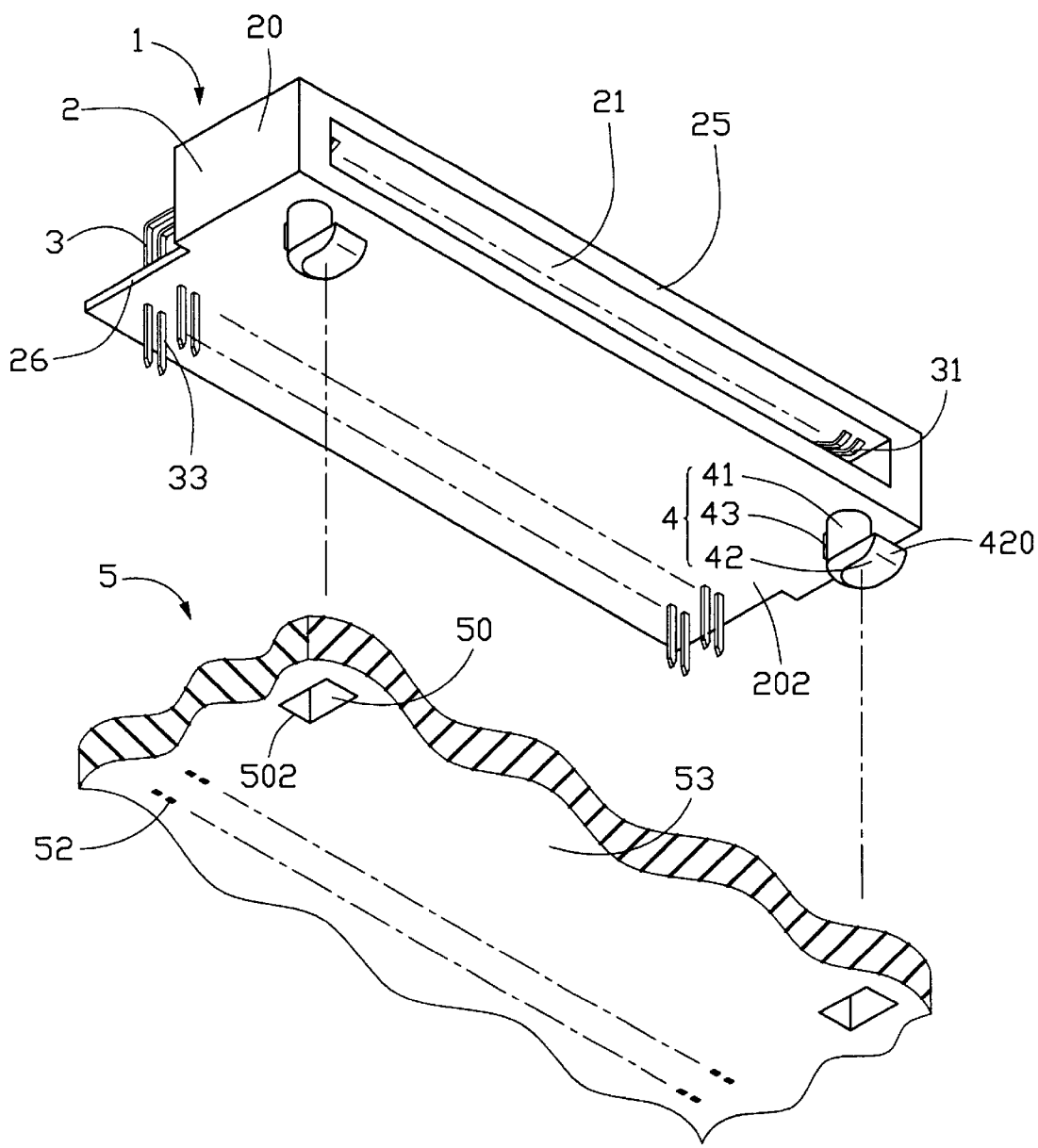
FIG. 1 is a perspective view of an electrical connector with board locks in accordance with the present invention and a circuit board.
Figure 2:
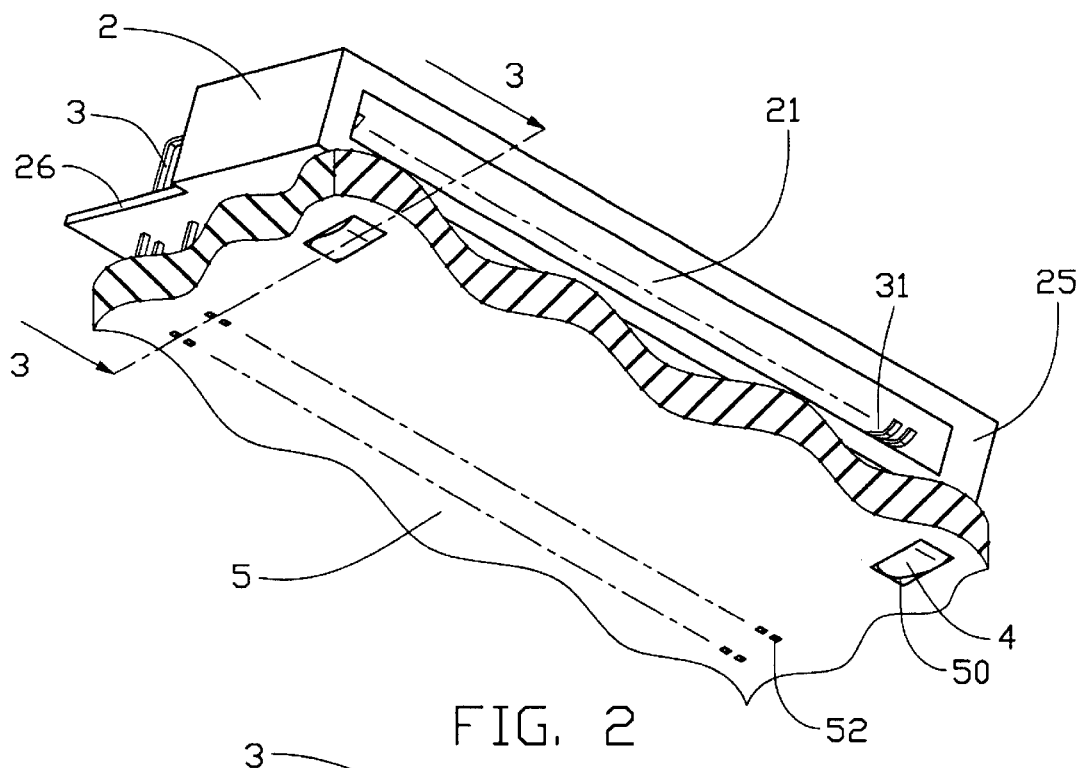
FIG. 2 is a perspective view showing the connector of FIG. 1 initially mounted on the circuit board in an inclined manner.

Referring to FIG. 1, an electrical connector 1 in accordance with the present invention comprises an insulative housing 2, a plurality of terminals 3 retained in the housing 2, and a pair of board locks 4 integrally formed at opposite ends of the housing 2 for being received in corresponding through holes 50 of a circuit board 5.

The housing 2 includes a rectangular body portion 20 and a planar positioning portion 26 integrally extending from the body portion 20. The body portion 20 defines an elongated receiving cavity 21 through a mating face 25 of the housing 2 for receiving a complementary connector (not shown).

Figure 3:
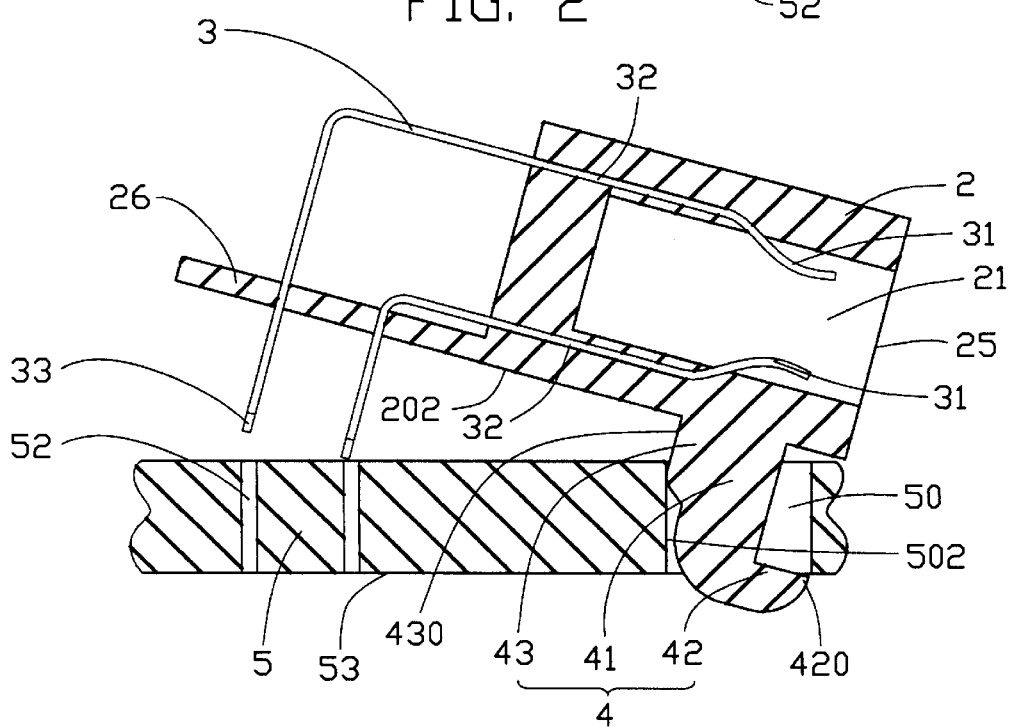
FIG. 3 is a cross-sectional view taken along section line 3—3 in FIG. 2.
Figure 4:
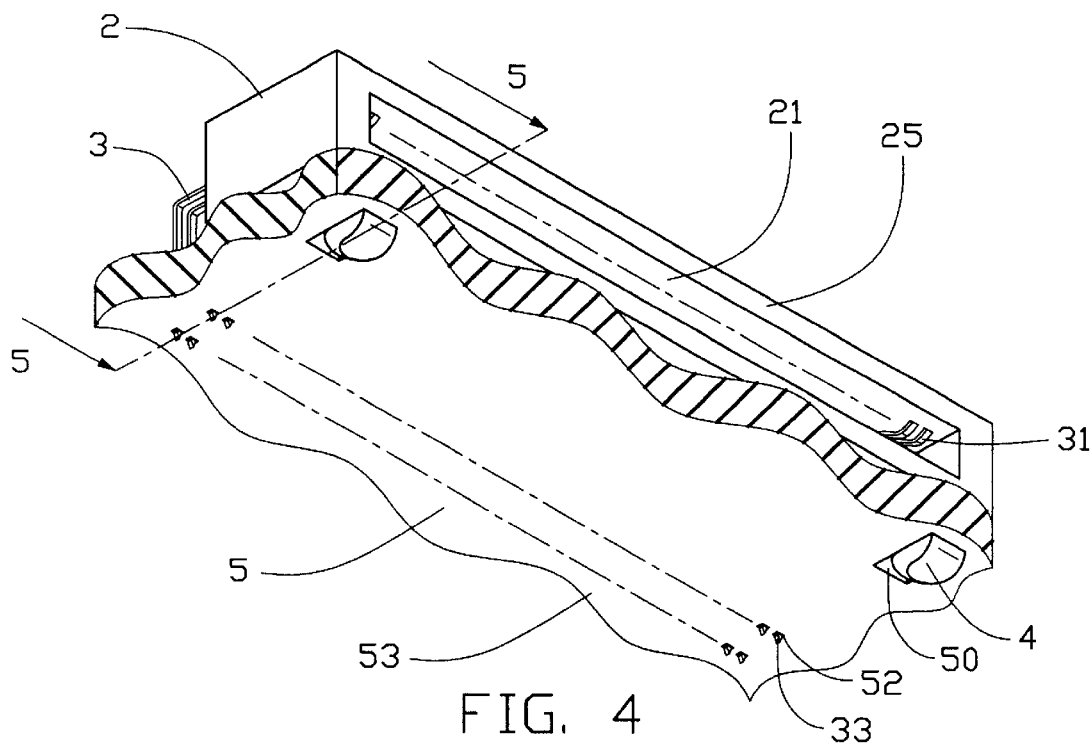
FIG. 4 is a perspective view showing the connector of FIG. 1 completely mounted on the circuit board.

Each terminal 3 includes a mating portion 31 projecting into the receiving cavity 21 for engaging with a corresponding terminal of the complementary connector, a retention portion 32 (FIG. 3) embedded in the body portion 20 of the housing 2, and a right-angle tail portion 33 extending through the positioning portion 26 of the housing 2 for being received within corresponding insertion holes 52 defined in the circuit board 5.

Figure 5:
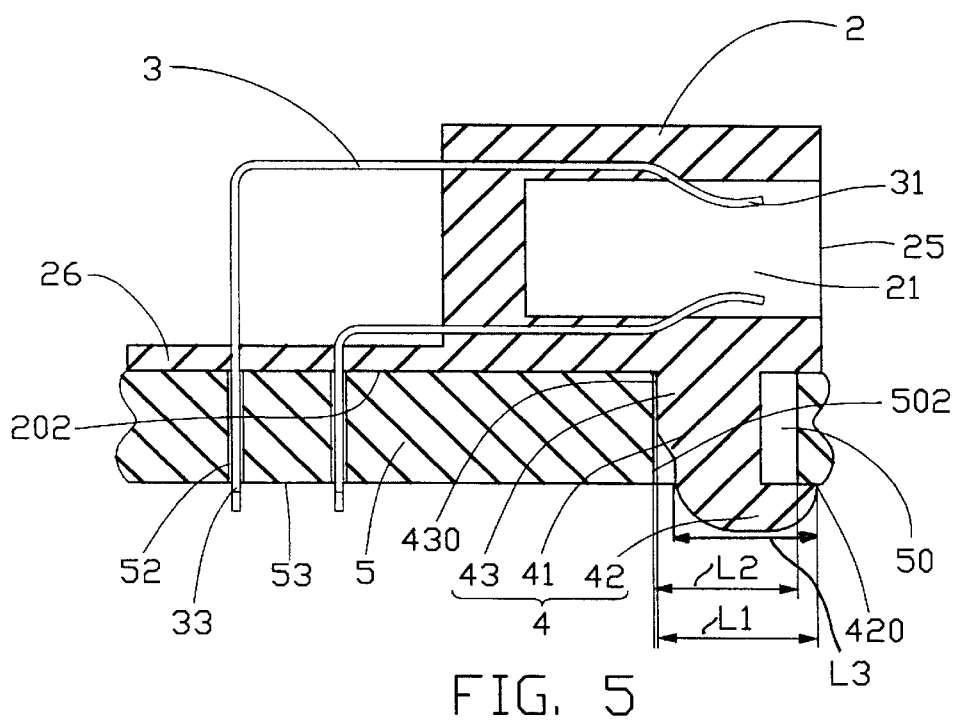
FIG. 5 is a cross-sectional view taken along section line 5—5 in FIG. 4.

The pair of board locks 4 integrally and downwardly extends from a mounting face 202 of the housing 2. Each board lock 4 is generally of a J-shaped configuration and includes a cylindrical connecting portion 41 extending perpendicularly from the mounting face 202 of the housing 2, a hook 42 formed at a free end of the connecting portion 41 and having a free end 420 extending in a direction toward the mating face 25 of the housing 2, and a rib 43 integrally projecting from the connecting portion 41 in a direction opposite to the extending direction of the free end 420 of the hook 42. The rib 43 extends along the connecting portion 41 for a predetermined distance. As clearly shown in FIG. 5, a horizontal distance "L1" between the free end 420 of the hook 42 and an outer side 430 of the rib 43 is larger than a horizontal dimension "L2" of the through hole 50 of the circuit board 5. On the other hand, the horizontal distance "L3" between the free end 420 of the hook 42 and the outer side of the connecting portion 41 is preferably either equal to or smaller than "L2" for easy installation.

Referring to FIGS. 2–5, when the connector 1 is mounted on the circuit board 5, the connector 1 is first placed in an inclined manner relative to the circuit board 5 to allow ZIF insertion of the board locks 4 into the through holes 50. The connector 1 is then pushed to arrive at a horizontal position where the mounting face 202 of the housing 2 is parallel to the circuit board 5. At the same time, the tail portions 33 of the terminals 3 are resiliently inserted into the insertion holes 52 of the circuit board 5. Because the horizontal distance "L1" between the free end 420 of the hook 42 and the outer side 430 of the rib 43 is larger than the horizontal dimension "L2" of the through hole 50, during this pushing process of the connector 1, the rib 43 abuts against an inner wall 502 of the through hole 50 to enable the hook 42 to engage with a bottom face 53 of the circuit board 5, whereby the connector 1 is reliably positioned on the circuit board 5 before the tail portions 33 of the terminals 3 are subject to a soldering process. It is noted that such a configuration of the board lock 4 and the relationship between the board locks 4 and the through holes 50 can prevent the board locks 4 from being pulled out from the through holes 50 in a direction perpendicular to the circuit board 5.

To disassemble the connector 1 from the circuit board 5, a rear portion of the connector 1 is lifted in an inclined manner relative to the circuit board 5 (shown in FIG. 3) to disengage the tail portions 33 of the terminals 3 from the insertion holes 52 of the circuit board, whereby the board locks 4 of the connector 1 can be ZIF pulled out from the through holes 50 of the circuit board 5. Thus, the connector 1 is conveniently removed from the circuit board 5 and can be reused.

It should be understood that the concept of the present invention is also applicable to other types of electrical connectors.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly comprising:

a circuit board defining a pair of through holes therein; and an electrical connector mounted on the circuit board and comprising:

an insulative housing having a mounting face;

a plurality of terminals retained in the insulative housing for electrical connection with the circuit board; and a pair of board locks including a connecting portion downwardly extending from the mounting face of the housing, a hook formed at a free end of the connecting portion for engaging with a bottom face of the circuit board and having a free end extending in a direction toward the mating face of the housing, and a rib projecting from the connecting portion in a direction opposite to the extending direction of a free end of the hook for abutting against an inner wall of a corresponding through hole of the circuit board;

wherein a horizontal distance between a free end of the hook and an outer side of the rib is larger than a horizontal dimension of the through hole of the circuit board;

wherein the board lock is generally of a J-shaped configuration and the connecting portion is of a cylindrical shape;

wherein the rib extends along the connecting portion for a predetermined distance;

wherein the housing comprises a mating face perpendicular to the mounting face, and the free end of the hook of the board lock perpendicularly extends from the connecting portion in a direction toward the mating face of the housing;

wherein a horizontal distance between the free end of the hook and an outer side of the connecting portion is not larger than the horizontal dimension of the through hole of the circuit board.

* * * * *